(12) United States Patent
Kondo

(10) Patent No.: US 11,047,914 B2
(45) Date of Patent: Jun. 29, 2021

(54) BONDING APPARATUS AND BONDING METHOD

(71) Applicant: Toyota Jidosha Kabushiki Kaisha, Toyota (JP)

(72) Inventor: Tadahiro Kondo, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 208 days.

(21) Appl. No.: 16/277,299

(22) Filed: Feb. 15, 2019

(65) Prior Publication Data
US 2019/0257885 A1 Aug. 22, 2019

(30) Foreign Application Priority Data
Feb. 16, 2018 (JP) .............................. JP2018-026066

(51) Int. Cl.
| | | |
|---|---|---|
| *B23K 20/00* | (2006.01) | |
| *G01R 31/364* | (2019.01) | |
| *B23K 20/10* | (2006.01) | |
| *G01R 31/389* | (2019.01) | |
| *G01R 31/3842* | (2019.01) | |
| *G01R 31/385* | (2019.01) | |
| *H01M 50/502* | (2021.01) | |
| *H01M 50/531* | (2021.01) | |
| *H01M 50/543* | (2021.01) | |

(52) U.S. Cl.
CPC ............ *G01R 31/364* (2019.01); *B23K 20/10* (2013.01); *G01R 31/389* (2019.01); *G01R 31/3842* (2019.01); *G01R 31/3865* (2019.01); *H01M 50/502* (2021.01); *H01M 50/531* (2021.01); *H01M 50/543* (2021.01)

(58) Field of Classification Search
CPC ... H01L 2224/78; H01L 22/00; B23K 20/004; B23K 20/10
See application file for complete search history.

(56) References Cited

U.S. PATENT DOCUMENTS

| | | | |
|---|---|---|---|
| 8,844,368 B2 * | 9/2014 | Peecock ................ | G01L 5/0033 73/827 |
| 9,919,471 B2 * | 3/2018 | Raszillier .............. | B29C 66/934 |
| 2006/0208037 A1 * | 9/2006 | Siepe .................... | H01L 24/85 228/180.5 |

(Continued)

FOREIGN PATENT DOCUMENTS

JP        2011-242394 A     12/2011

*Primary Examiner* — Erin B Saad
(74) *Attorney, Agent, or Firm* — Dinsmore & Shohl LLP

(57) ABSTRACT

A bonding apparatus according to the present disclosure includes a bonding tool that bonds a wire to a terminal, a guide member that guides the wire, a clamp made of a conductive material and capable of fixing the wire, and an electrical property measurement unit electrically connected to the clamp. The clamp is configured to be electrically connected to the wire when the wire is fixed. After the wire is bonded to the terminal using the bonding tool, the bonding apparatus carries out a tensile test for fixing the wire using the clamp and pulling the wire bonded to the terminal with a predetermined load and an electrical property test for measuring an electrical resistance of a junction between the wire and the terminal using the electrical property measurement unit.

7 Claims, 12 Drawing Sheets

(56) References Cited

U.S. PATENT DOCUMENTS

2009/0188696 A1\* 7/2009 Uno .................. H01L 24/43
  174/126.2
2011/0277556 A1\* 11/2011 Peecock ............. G01L 5/0033
  73/827

\* cited by examiner

OPENED ⇔ FIXED

US 11,047,914 B2

BONDING APPARATUS AND BONDING METHOD

CROSS REFERENCE TO RELATED APPLICATIONS

This application is based upon and claims the benefit of priority from Japanese patent application No. 2018-026066, filed on Feb. 16, 2018, the disclosure of which is incorporated herein in its entirety by reference.

BACKGROUND

The present disclosure relates to a bonding apparatus and a bonding method.

One method of electrically connecting a battery to a terminal (a bus bar) is to use wire bonding. In such a bonding method, a tensile test is carried out after a wire is bonded to a terminal in order check the bonding state between the wire and the terminal. Japanese Unexamined Patent Application Publication No. 2011-242394 discloses a bonding method for carrying out a tensile test after a bonding process.

SUMMARY

As described above, when a wire is bonded to a terminal using a bonding apparatus, a tensile test is carried out in order to check the bonding state between the wire and the terminal after the wire is bonded to the terminal. Further, in order to check an electrical connection state between the wire and the terminal, an electrical property test for measuring an electrical resistance of a junction between the wire and the terminal is carried out in a process different from the process in which the tensile test is carried out.

However, there is a problem that the electrical property test becomes complicated, because this electrical property test is carried out by extracting and inspecting a part of a product.

The present disclosure provides a bonding apparatus and a bonding method that can simplify the electrical property test.

A bonding apparatus for bonding a wire to a terminal according to the present disclosure includes: a bonding tool configured to bond the wire supplied to a leading end part of the bonding tool to the terminal; a guide member configured to guide the wire supplied to the leading end part of the bonding tool; a clamp made of a conductive material and configured to be able to fix the wire; and an electrical property measurement unit electrically connected to the clamp. The clamp is configured to be electrically connected to the wire when it fixes the wire. After the wire is bonded to the terminal using the bonding tool, the bonding apparatus carries out a tensile test for fixing the wire using the clamp and pulling the wire bonded to the terminal with a predetermined load and an electrical property test for measuring an electrical resistance of a junction between the wire and the terminal using the electrical property measurement unit.

In the bonding apparatus according to the present disclosure, the clamp is made of a conductive material, and the clamp is configured to be electrically connected to the wire when it fixes the wire. In addition, the electrical property measurement unit is electrically connected to the clamp. Thus, the tensile test and the electrical property test can be carried out in the same process, and the electrical property test can be carried out in the manufacturing line. This eliminates the need for extracting and inspecting a part of a product, and thus simplifies the electrical property test.

In the above bonding apparatus, the guide member may be made of an insulating material, and when the clamp fixes the wire, it may clamp the wire by the guide member and the clamp. Such a configuration enables the wire to be reliably fixed using the clamp, and also enables the clamp and the wire to be electrically connected to each other when the wire is fixed.

In the above bonding apparatus, the guide member may include a shape of a U-shaped cross section, the wire may be disposed in such a way that it passes through inside of the U-shaped cross section of the guide member, and when the clamp fixes the wire, it may clamp the wire by the guide member and the clamp inside the U-shaped cross section of the guide member. Such a configuration enables the wire to be reliably fixed using the clamp.

In the above bonding apparatus, the terminal may be one electrode of a battery, and after the wire is bonded to the one electrode of the battery using the bonding tool, the bonding apparatus may carry out a tensile test for fixing the wire using the clamp and pulling the wire bonded to the one electrode of the battery with a predetermined load and an electrical property test for measuring a summed value of an electrical resistance of a junction between the wire and the terminal and an internal resistance of the battery using the electrical property measurement unit. Such a configuration can simplify the electrical property test after the wire is bonded to the electrode of the battery.

In the above bonding apparatus, the electrical property measurement unit may further measure an electromotive force of the battery. As the electromotive force of the battery is measured at the same time when the electrical property test is carried out, it is possible to detect a defect of the battery at an early stage.

In the above bonding apparatus, the electrical property measurement unit may include: a variable resistor electrically connected between the clamp and another electrode of the battery; an ammeter configured to measure a current flowing through the variable resistor; and a voltmeter configured to measure a voltage across the variable resistor. The electrical property measurement unit may calculates the summed value of the electrical resistance in the junction and the internal resistance of the battery and the electromotive force using a first current value of the ammeter and a first voltage value of the voltmeter measured when the variable resistor is set to a first resistance value and a second current value of the ammeter and a second voltage value of the voltmeter measured when the variable resistor is set to a second resistance value. Such a configuration of the electrical property measurement unit can simplify the measurement of the summed value of the electrical resistance in the junction and the internal resistance of the battery and the electromotive force.

A bonding method according to the present disclosure using a bonding apparatus for bonding a wire to a terminal including: a bonding tool configured to bond the wire supplied to a leading end part of the bonding tool to the terminal; a guide member configured to guide the wire supplied to the leading end part of the bonding tool; a clamp made of a conductive material and configured to be able to fix the wire and to be electrically connected to the wire when it fixes the wire; and an electrical property measurement unit electrically connected to the clamp. The bonding method includes: a first process of bonding the wire to the terminal using the bonding tool; and after the first process, a second process of carrying out a tensile test for fixing the wire using the clamp and pulling the wire bonded to the terminal with a predetermined load and an electrical, property test for measuring an electrical resistance of a junction between the wire and the terminal using the electrical property measurement unit.

In the bonding method according to the present disclosure, the clamp is electrically connected to the wire when the clamp fixes the wire. In addition, the electrical property measurement unit is electrically connected to the clamp. Thus, the tensile test and the electrical property test can be carried out in the same process, and the electrical property test can be carried out in the manufacturing line. This eliminates the need for extracting and inspecting a part off product, and thus simplifies the electrical property test.

According to the present disclosure, it is possible to provide a bonding apparatus and a bonding method that can simplify the electrical property test.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

Hereinafter, embodiments of the present disclosure will be described with reference to the drawings.

Figure 1:
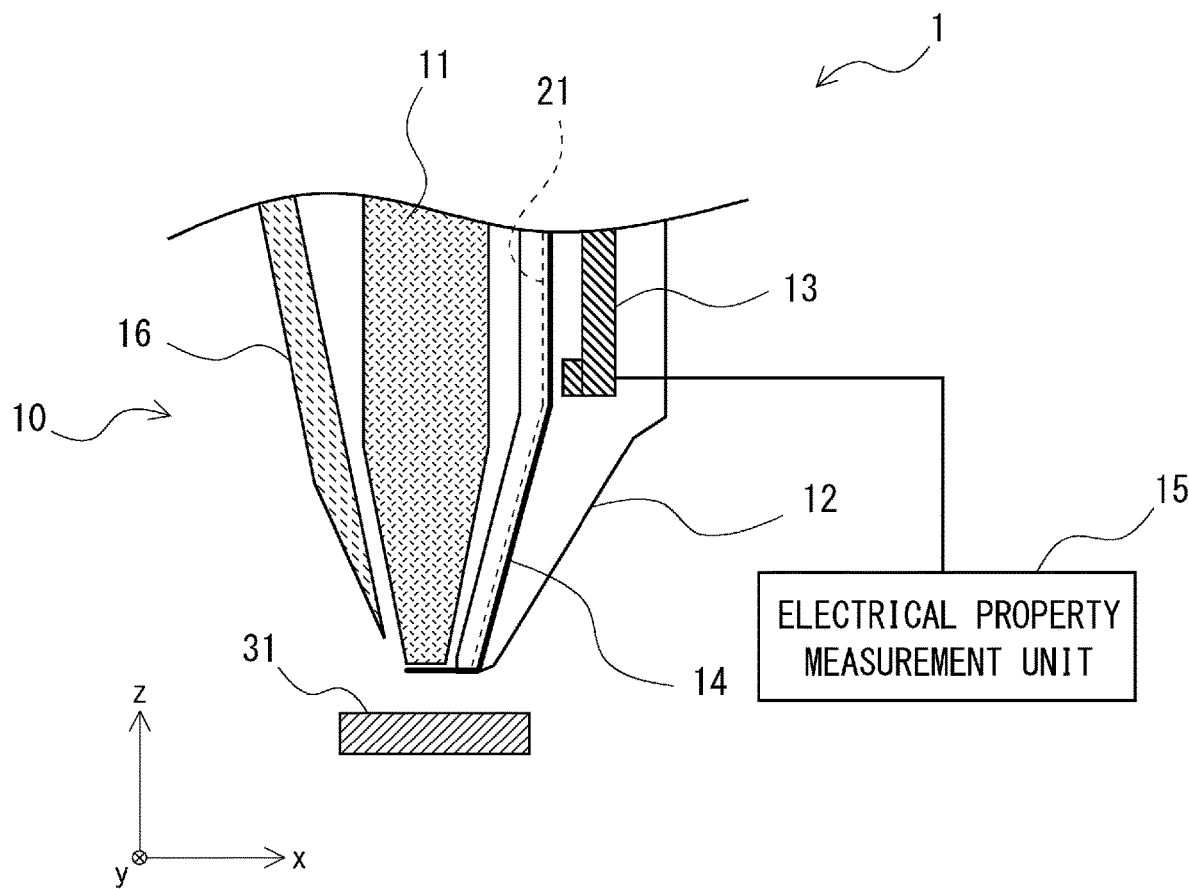
FIG. 1 is a cross-sectional view for describing a bonding apparatus according to a first embodiment.

FIG. 1 is a cross-sectional view for describing a bonding apparatus according to a first embodiment. As shown in FIG. 1, a bonding apparatus 1 according to this embodiment includes a head part 10. The head part 10 includes a bonding tool 11, a guide member 12, a clamp 13, and a cutter 16. The head part 10 is configured to be movable in an x-axis direction, a y-axis direction, and a z-axis direction using a driving mechanism (not shown). Further, the head part 10 may be configured to be rotatable about the z-axis using the driving mechanism (not shown). When the head part 10 moves, the bonding tool 11, the guide member 12, the clamp 13, and the cutter 16 integrally move.

The bonding tool 11 bonds the wire 14, which is supplied to a leading end part of the bonding tool 11, to a terminal 31 (e.g., a bus bar), which the wire 14 is to be bonded to. The bonding tool 11 is made of, for example, a metal material. The bonding tool 11 is connected to a vibrating body (not shown) on the positive side in the z-axis direction of the bonding tool 11. Ultrasonic vibrations generated by the vibrating body are transmitted to the bonding tool 11, whereby the leading end part of the bonding tool 11 ultrasonically vibrates. When the wire 14 is bonded to the terminal 31, the leading end part of the bonding tool 11 is ultrasonically vibrated while the wire 14 is pressed against the terminal 31 using the bonding tool 11. Then, the wire 14 is bonded to the terminal 31.

Figure 2:
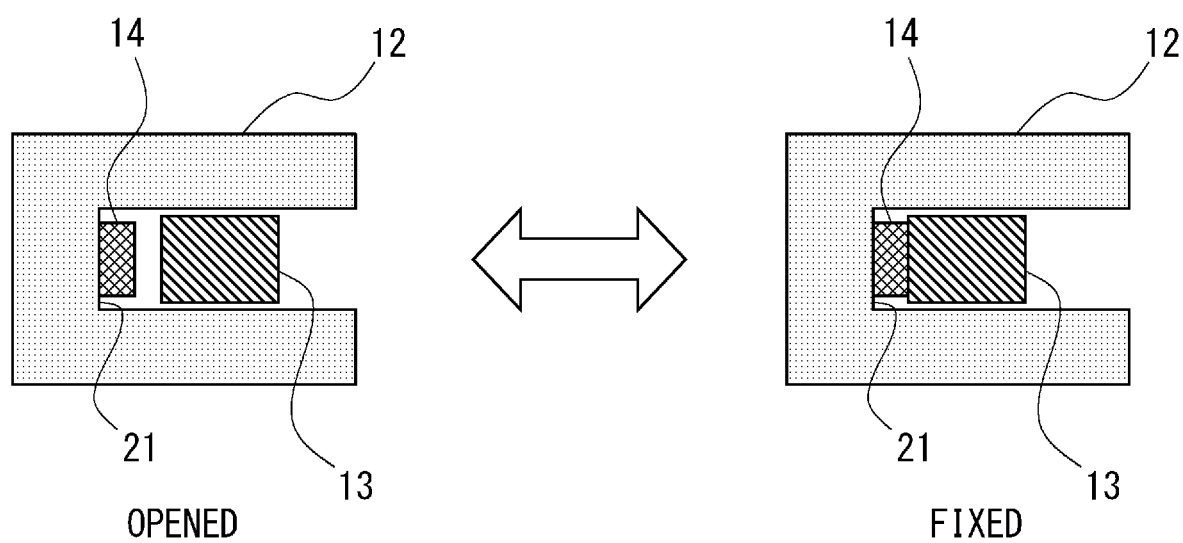
FIG. 2 is an enlarged sectional view of a guide member and a clamp shown in FIG. 1.
Figure 2:
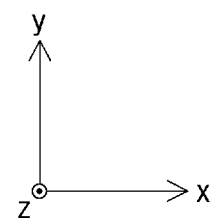

The guide member 12 is configured to guide the wire 14 supplied to the leading end part of the bonding tool 11. The clamp 13 is configured to be able to fix the wire 14. FIG. 2 is an enlarged sectional view of the guide member 12 and the clamp 13 shown in FIG. 1 in the xy plane. As shown in FIG. 2, the guide member 12 has a U-shaped cross-sectional shape. The wire 14 is disposed in such a way that it passes through the inside of the U-shaped cross section (i.e., a guide surface 21) of the guide member 12. The clamp 13 is configured to be movable in the x-axis direction inside the U-shaped cross section of the guide member 12. Clamp driver (not shown) is provided on the positive side in the z-axis direction of the clamp 13. The clamp 13 is configured to be movable in the x-axis direction using this clamp driver (not shown).

As shown in the left drawing, of FIG. 2, in a state where the wire 14 is not fixed (an open state), the clamp 13 is disposed at a position separated from the wire 14 in the x-axis direction. On the other hand, as shown in the right drawing of FIG. 2, when the wire 14 is fixed, the clamp 13 is moved to the negative side in the x axis direction inside the U-shaped cross section of the guide member 12. Then, the wire 14 is clamped by the guide surface 21 of the guide member 12 and the clamp 13, so that the wire 14 is fixed.

The wire 14 is a thin-wailed metal plate made of, for example, copper having excellent conductivity. The wire 14 is continuously supplied from, for example, wire supplier (not shown) to the leading end part of the bonding tool 11 along the guide member 12.

The clamp 13 is made of a conductive material (a metal material). Further, the guide member 12 is made of an insulating material. Thus, when the wire 14 is clamped by the guide member 12 and the clamp 13 to fix the wire 14, the clamp 13 is brought into contact with the wire 14, and the clamp 13 and the wire 14 are electrically connected to each other.

Moreover, as shown in FIG. 1, an electrical property measurement unit 15 is electrically connected to the clamp 13. After the wire 14 is bonded to the terminal 31 using the bonding tool 11, the electrical property measurement unit 15 measures an electrical property (specifically, an electrical resistance) at a junction between the wire 14 and the terminal 31.

Figure 3A:
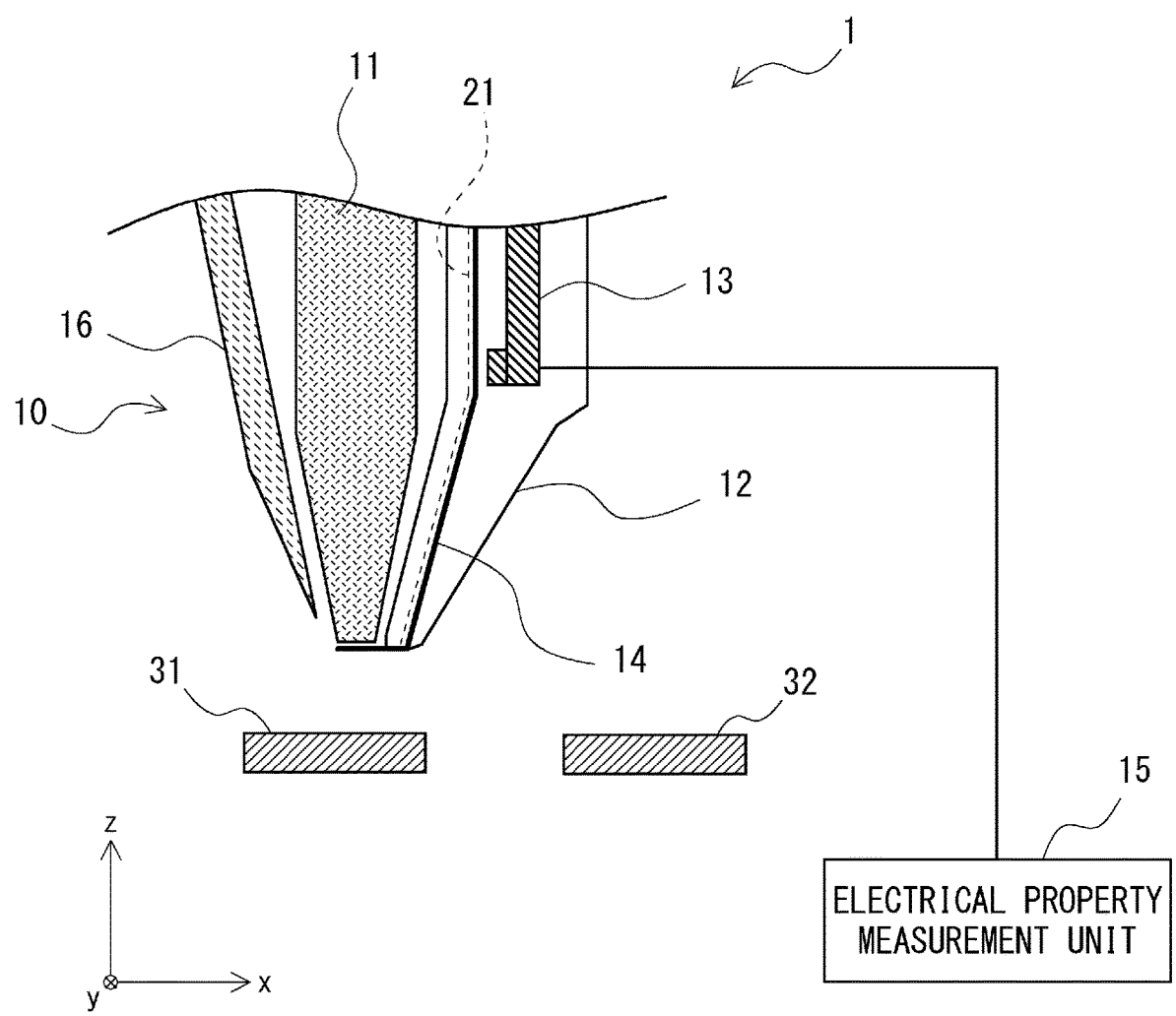
FIG. 3A is a view for describing a bonding process (a positioning process)
Figure 3B:
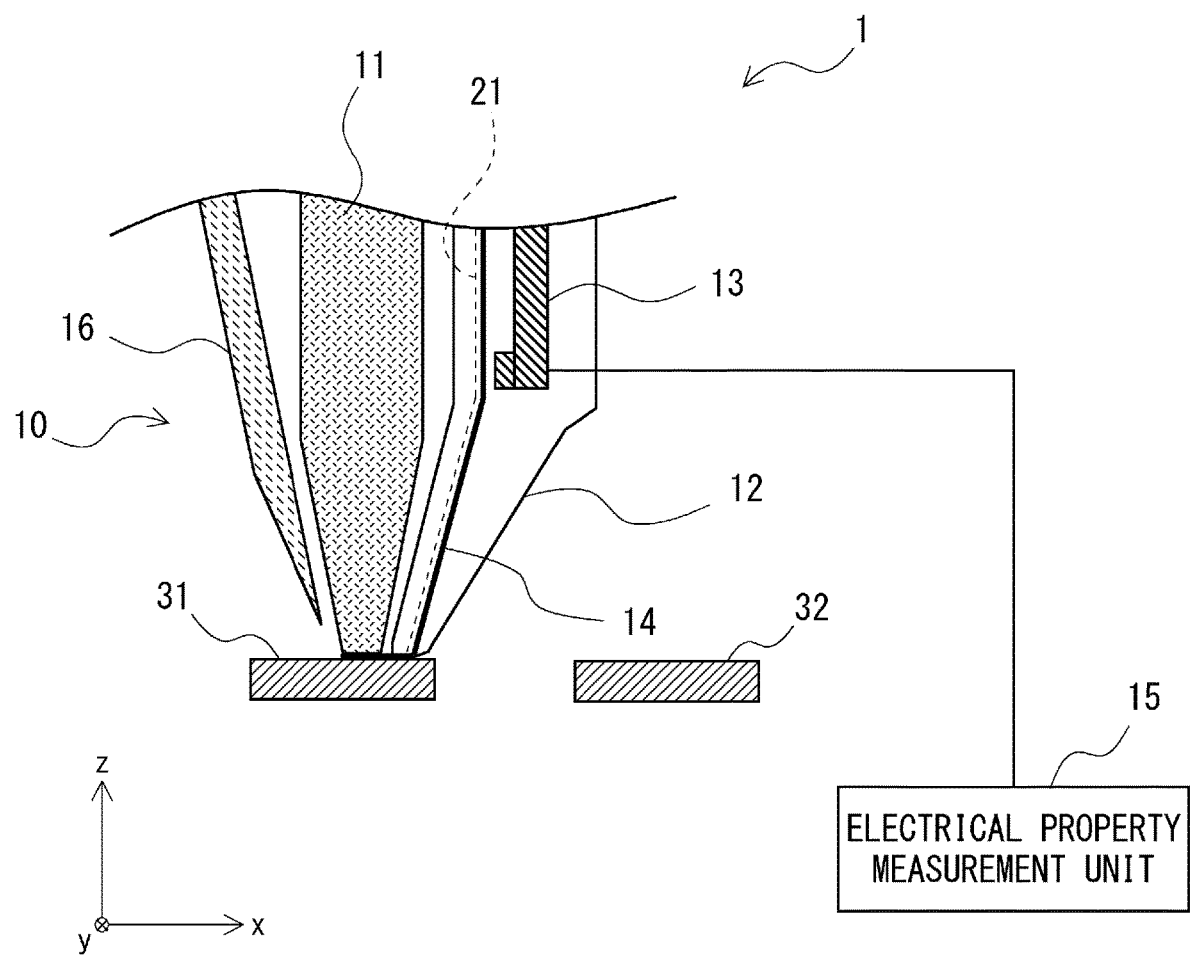
FIG. 3B is a view for describing the bonding process (a bonding process)
Figure 3C:
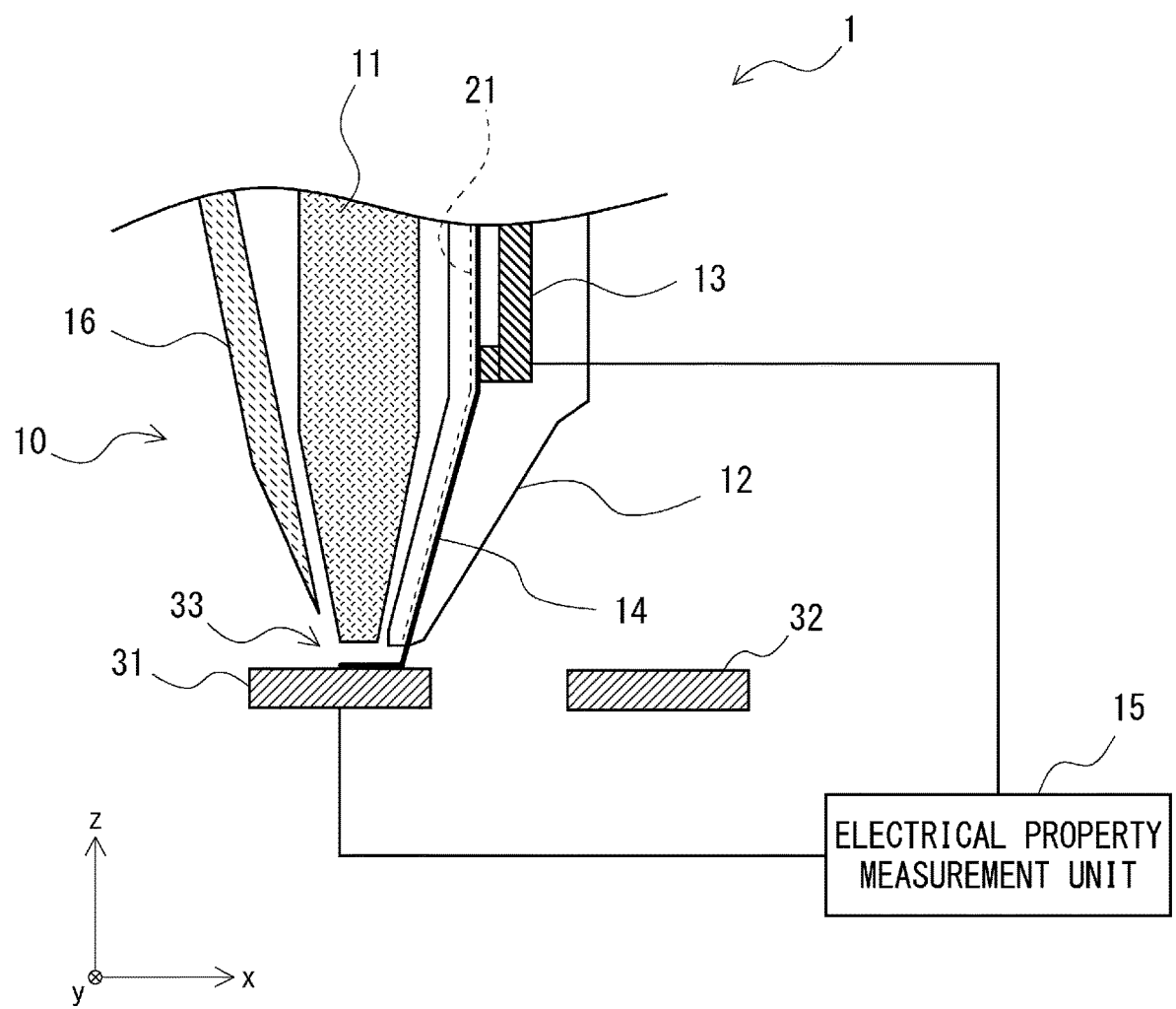
FIG. 3C is a view for describing the bonding process (a testing process)
Figure 3D:
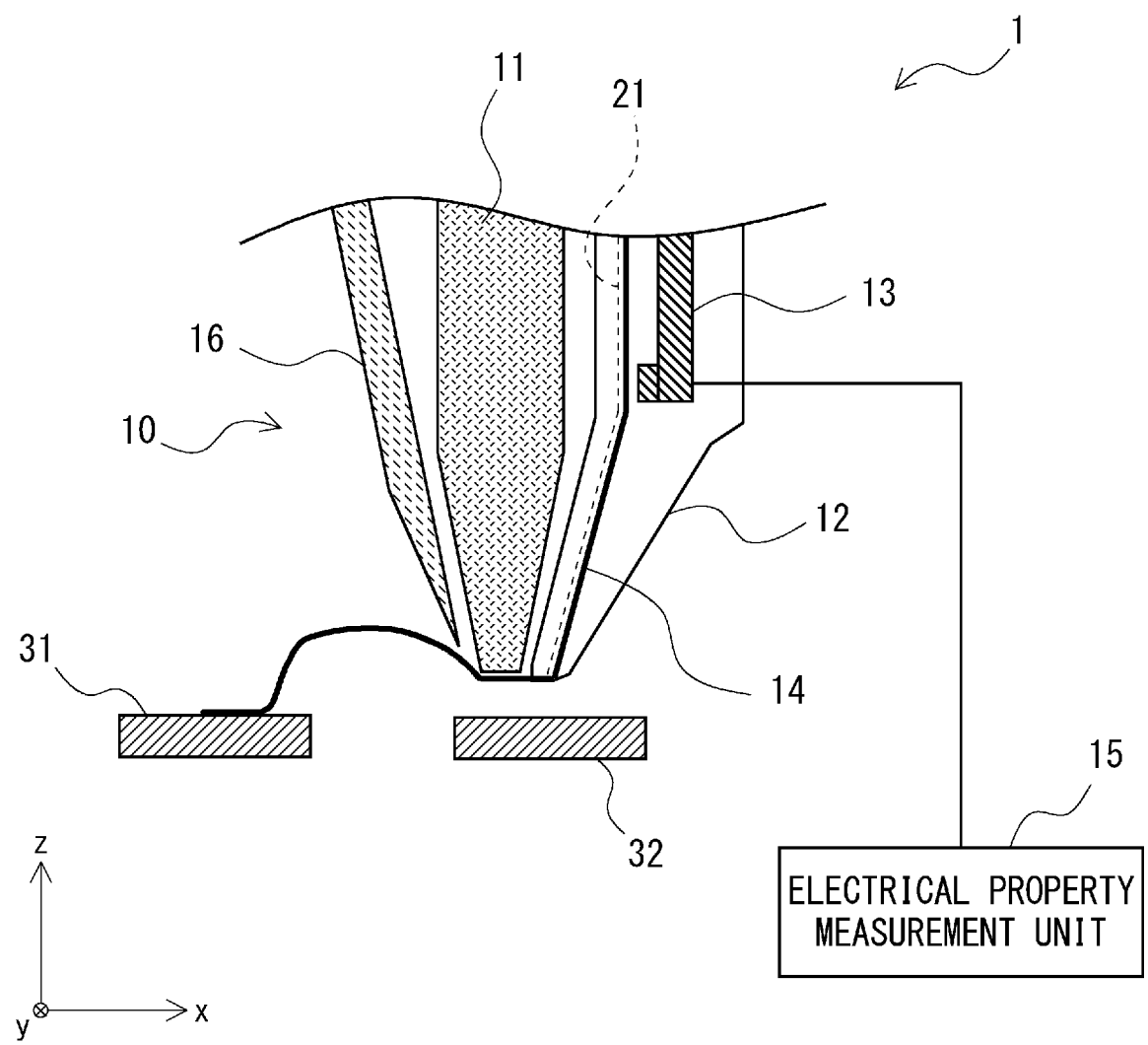
FIG. 3D is a view for describing the bonding process (a positioning process)
Figure 3E:
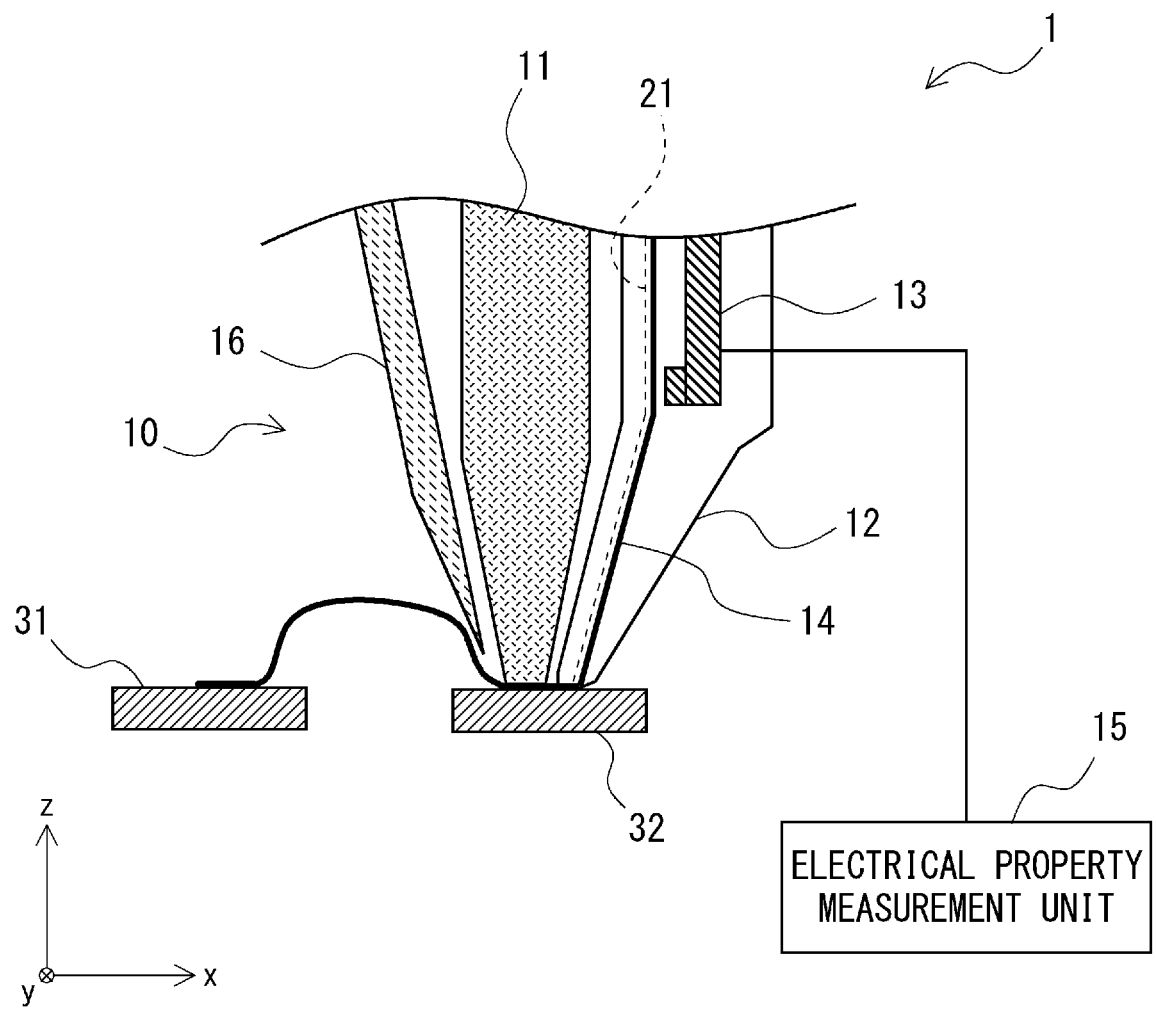
FIG. 3E is a view for describing the bonding process (a bonding process)
Figure 3F:
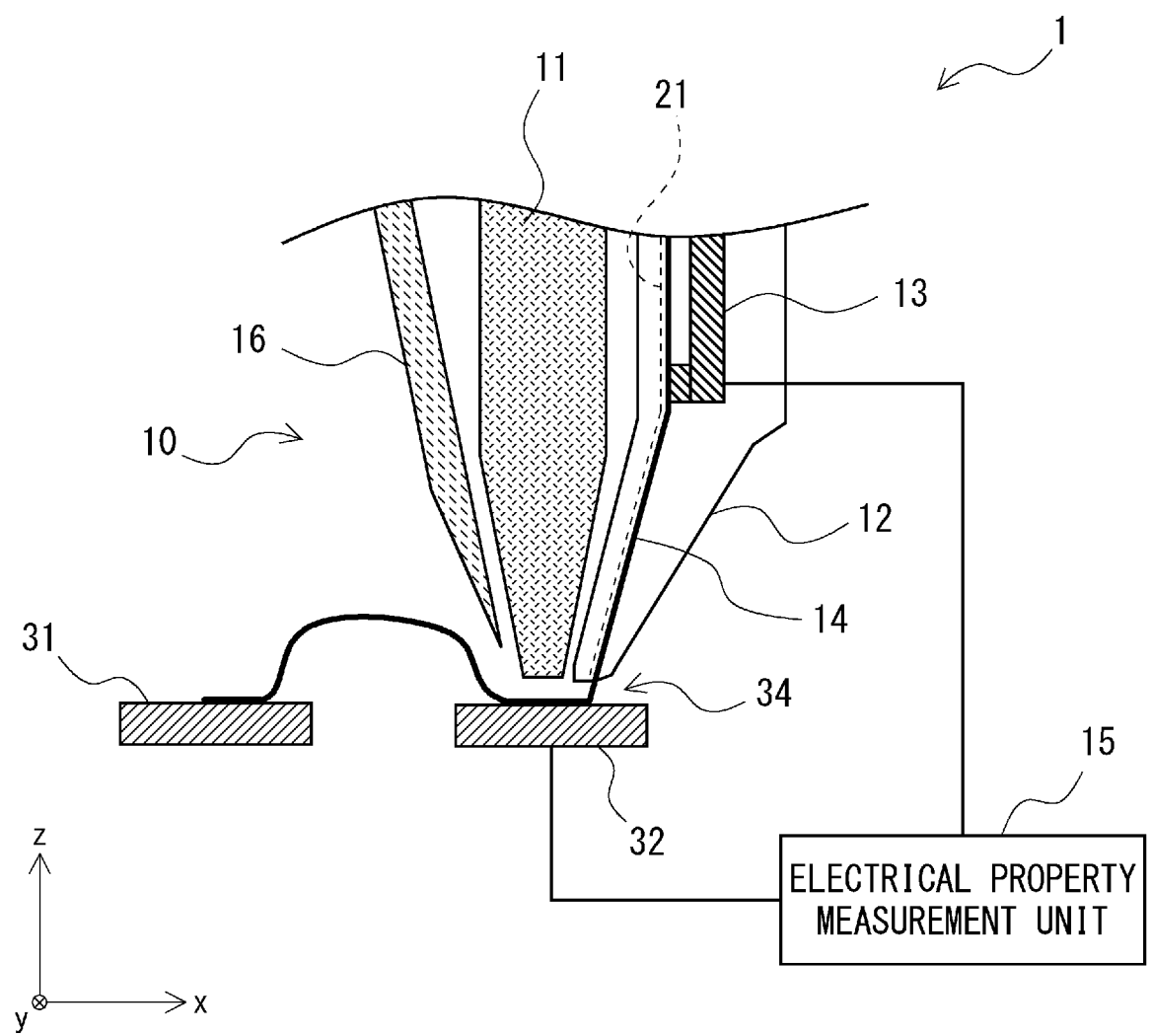
FIG. 3F is a view for describing the bonding process (a testing process)
Figure 3G:
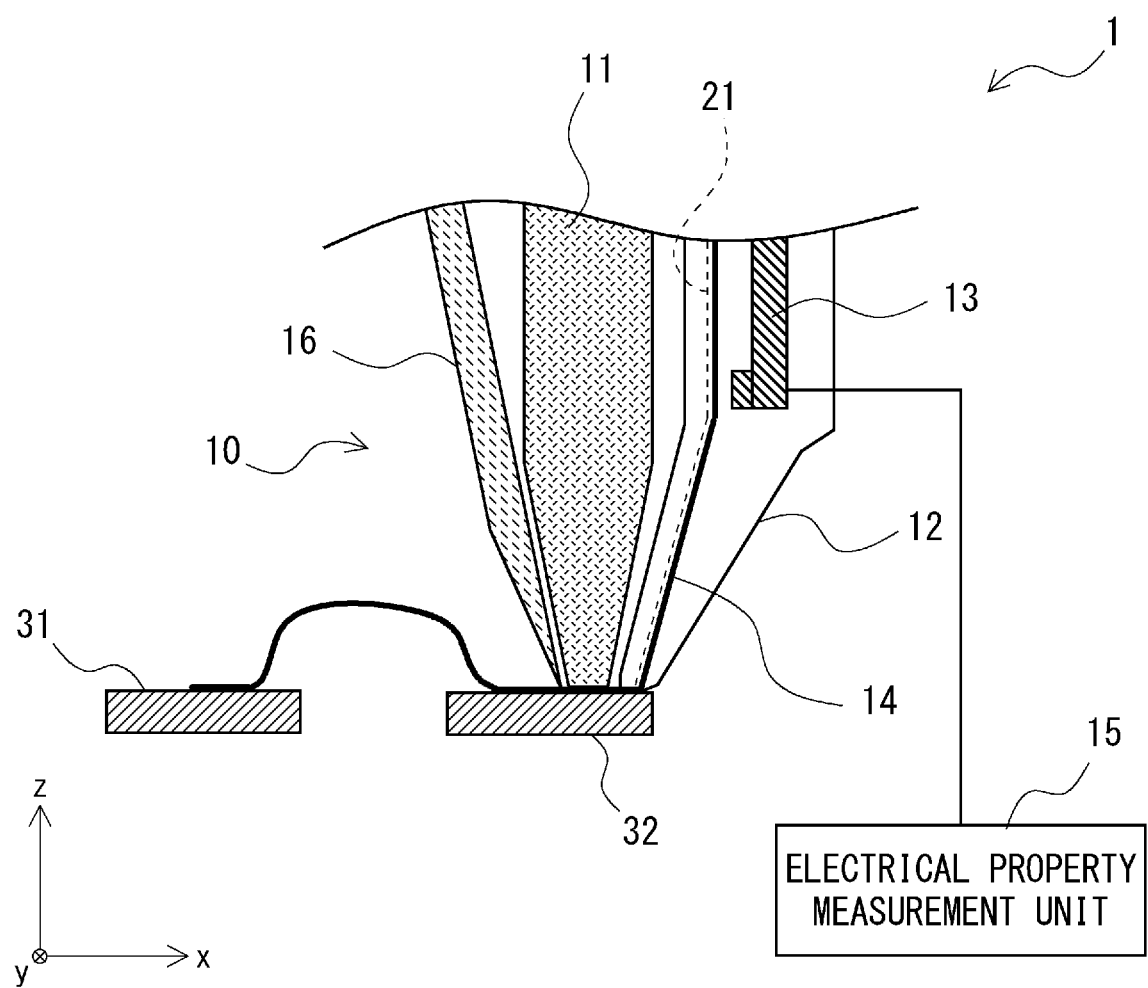
FIG. 3G is a view for describing the bonding process (a cutting process)

After the wire 14 is bonded to the terminal 31 using the bonding tool 11, the cutter 16 cuts the wire 14 at a predetermined position (see FIG. 3G). For example, the cutter 16 is configured to be movable toward the leading end part side of the bonding tool 11 using cutter driver (not shown).

Next, an operation (a bonding method) of the bonding apparatus according to this embodiment will be described with reference to FIGS. 3A to 3H. Hereinafter, as an example, an operation when the terminal 31 and a terminal 32 are connected to each other using the wire 14 will be described.

First, as shown in FIG. 3A, the head part 10 of the bonding apparatus 1 is moved above the terminal 31 to which the wire 14 is bonded. Specifically, the head part 10 is moved in the x-axis direction, the y-axis direction, and the z-axis direction using a driving mechanism (not shown), and the head part 10 is disposed on the upper side of the terminal 31. At this time, the position of the wire 14 is adjusted so that the wire 14 covers the leading end part of the bonding tool 11.

After that, as shown in FIG. 3B, the head part 10 is moved to the negative side (a lower side) in the z-axis direction. Next, the leading end part of the bonding tool 11 is ultrasonically vibrated while the wire 14 is pressed against the terminal 31 using the bonding tool 11. Then, the wire 14 is bonded to the terminal 31.

After that, as shown in FIG. 3C, the wire 14 is fixed using the clamp 13, and a tensile test for pulling the wire 14 bonded to the terminal 31 with a predetermined load is carried out. Specifically, the clamp 13 is moved to the negative side in the x-axis direction, and the wire 14 is fixed by clamping the wire 14 by the guide surface 21 of the guide member 12 and the clamp 13. In this state, the head part 10 is moved to the positive side (the upper side) in the z-axis direction, and the predetermined load is applied to a junction 33 where the terminal 31 and the wire 14 are bonded to each other. Then, a state in which the wire 14 bonded to the terminal 31 is pulled with the predetermined load is continued for a predetermined time, and it is determined whether the bonding state is acceptable based on an amount of displacement of the wire 14 after a predetermined time has elapsed.

Figure 4:
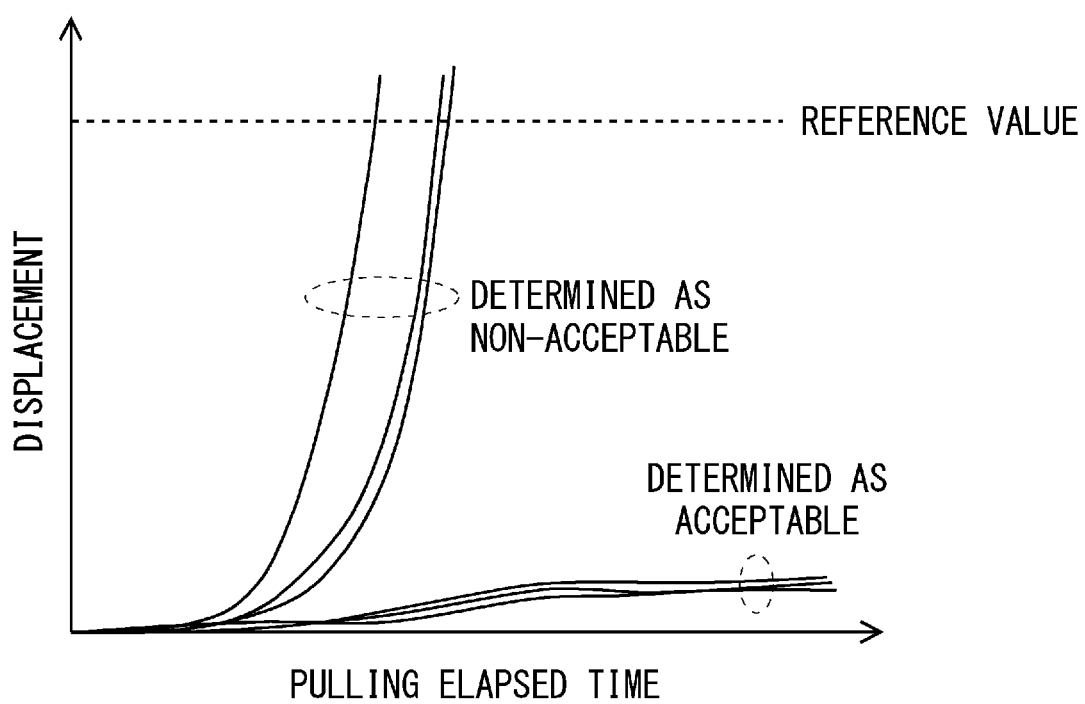
FIG. 4 is a graph for describing a tensile test.

FIG. 4 is a graph for describing the tensile test. As shown in FIG. 4, a state in which the wire 14 bonded to the terminal 31 is pulled with the predetermined load is continued for the predetermined time, and when the amount of displacement of the wire 14 after the predetermined time has elapsed is less than or equal to a predetermined reference value, the bonding state is determined to be satisfactory (OK). In other words, in this case, the amount of displacement of the wire 14 becomes less than or equal to the predetermined reference value, because the wire is kept in a state in which it is bonded to the terminal 31 without being separated from the surface of the terminal 31 when the tensile test is carried out. Therefore, the bonding state is determined to be satisfactory.

On the other hand, as shown in FIG. 4, a state in which the wire 14 bonded to the terminal 31 is pulled with the predetermined load is continued for the predetermined time, and when the amount of displacement of the wire 14 after the predetermined time has elapsed is larger than the predetermined reference value, the bonding, state is determined to be defective (unsatisfactory). In other words, in this case, when the tensile test is carried out, the wire 14 bonded to the terminal 31 is separated from the surface of the terminal 31, and the amount of displacement of the wire 14 increases. Thus, it is determined that the bonding state is defective.

In the process shown in FIG. 3C, an electrical property test for measuring an electrical resistance of the junction 33 between the wire 14 and the terminal 31 is carried out using the electrical property measurement unit 15. Specifically, the electrical property measurement unit 15 is electrically connected to the terminal 31. Further, as described above, when the tensile test is carried out, the wire 14 is fixed using the clamp 13. At this time, the clamp 13 is abutted against the wire 14, and the clamp 13 and the wire 14 are electrically connected to each other. Then, the electrical property measurement unit 15, the clamp 13, the wire 14, and the terminal 31 are electrically connected to form a circuit. That is, the clamp 13 is electrically connected to the wire 14 and functions as a probe for measuring an electrical resistance. Note that the electrical property measurement unit 15 may be electrically connected to the terminal 31 in advance at a preparatory stage (before the process of FIG. 3A).

The electrical property measurement unit 15 measures an electrical resistance of the junction 33 between the wire 14 and the terminal 31 using the circuit formed at this time. That is, assuming that electrical resistances of the clamp 13, the wire 14, and the terminal 31 are extremely low, the electrical property measurement unit 15 measures the electrical resistance of a path including the clamp 13, the wire 14, and the terminal 31 to thereby measure the electrical resistance of the junction 33 between the wire 14 and the terminal 31.

When the electrical resistance of the junction 33 between the wire 14 and the terminal 31 is less than or equal to the predetermined reference value, it is determined that the electrical connection state is satisfactory. On the other hand, when the electrical resistance of the junction 33 between the wire 14 and the terminal 31 is larger than the predetermined reference value, it is determined that there is an electrical connection failure. In other words, in this case, since the wire 14 and the terminal 31 are not properly bonded to each other, it can be determined that an electrical connection failure has occurred at the junction 33 between the wire 14 and the terminal 31.

In this embodiment, as shown in FIG. 3C, the tensile test and the electrical property test are carried out in the same process.

Next, as shown in FIG. 3D, the clamp 13 is moved to the positive side in the x-axis direction, and the wire 14 is opened. In this state, the head part 10 is moved to the positive side in the x-axis direction. That is, when the head part 10 is moved from the terminal 31 to the terminal 32 in a state where the wire 14 is opened, the wire 14 can be extended from the terminal 31 to the terminal 32.

After that, as shown in FIG. 3E, the head part 10 is moved to the negative side (the lower side) in the z-axis direction. Then, the leading end part of the bonding tool 11 is ultrasonically vibrated while the wire 14 is pressed against the terminal 32 using the bonding tool 11. Then, the wire 14 is bonded to the terminal 32.

After that, as shown in FIG. 3F, the wire 14 is fixed using the clamp 13, and a tensile test for pulling the wire 14 bonded to the terminal 32 with the predetermined load is carried out. Moreover, an electrical property test for measuring an electrical resistance of a junction 34 between the wire 14 and the terminal 31 is carried out using the electrical property measurement unit 15. Note that the tensile test and the electrical property test in the process of FIG. 3F are the same as the tensile test and the electrical property test described in the process of FIG. 3C, and thus repeated descriptions will be omitted. Likewise, in the process of FIG. 3F, the tensile test and the electrical property test are carried out in the same process.

Figure 3H:
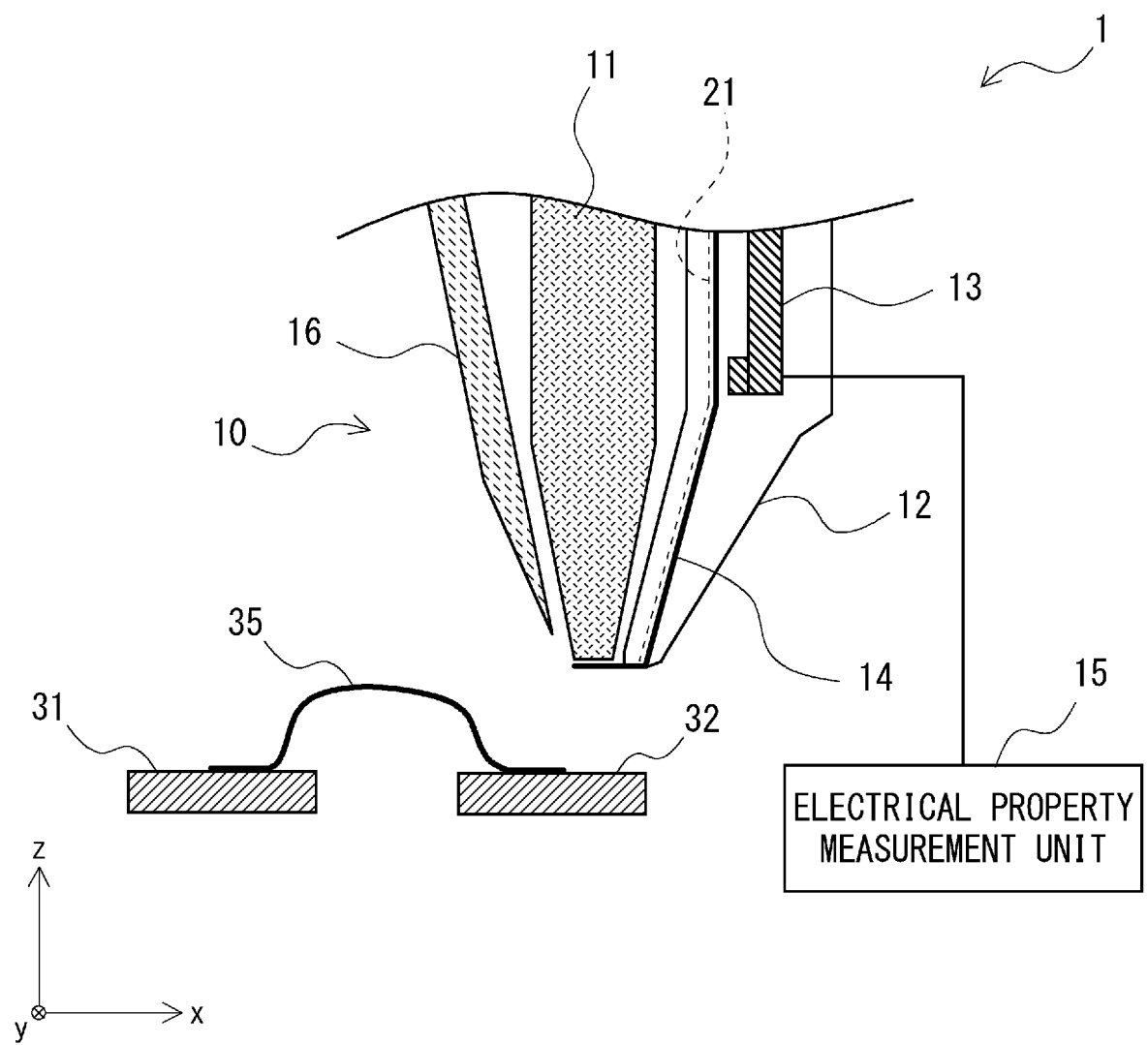
FIG. 3H is a view for describing the bonding process (end state)

Finally, as shown in FIG. 3G, the cutter 16 is moved to the leading end part side of the bonding tool 11 to cut the wire 14. After that, as shown in FIG. 3H, the head part 10 is moved to the positive side (an upper side) in the z-axis direction to separate the head part 10 from the terminal 32.

The terminal 31 and the terminal 32 can be connected to each other using a wire 35 (14) by the above-described operation.

In the related art, a tensile test is carried out in order to check the bonding state between a wire and a terminal after the wire is bonded to the terminal using a bonding apparatus. Further, an electrical property test for measuring an electrical resistance of the junction between the wire and the terminal is carried out in order to check an electrical connection state between the wire and the terminal in a process different from a process in which the tensile test is carried out.

However, there is a problem in the related art that the electrical property test becomes complicated, because this electrical property test is carried out by extracting and inspecting a part of a product.

In contrast, in this embodiment of the present disclosure, the clamp 13 is made of a conductive material, and the clamp 13 is configured to be electrically connected to the wire 14 when it fixes the wire 14. In addition, the electrical property measurement unit is electrically connected to the clamp. Thus, as shown in FIGS. 3C and 3F, the tensile test and the electrical property test can be carried out in the same process, and the electrical property test can be carried out in the manufacturing line. This eliminates the need for extracting and inspecting a part of a product, and thus simplifies the electrical property test.

Second Embodiment

Figure 5:
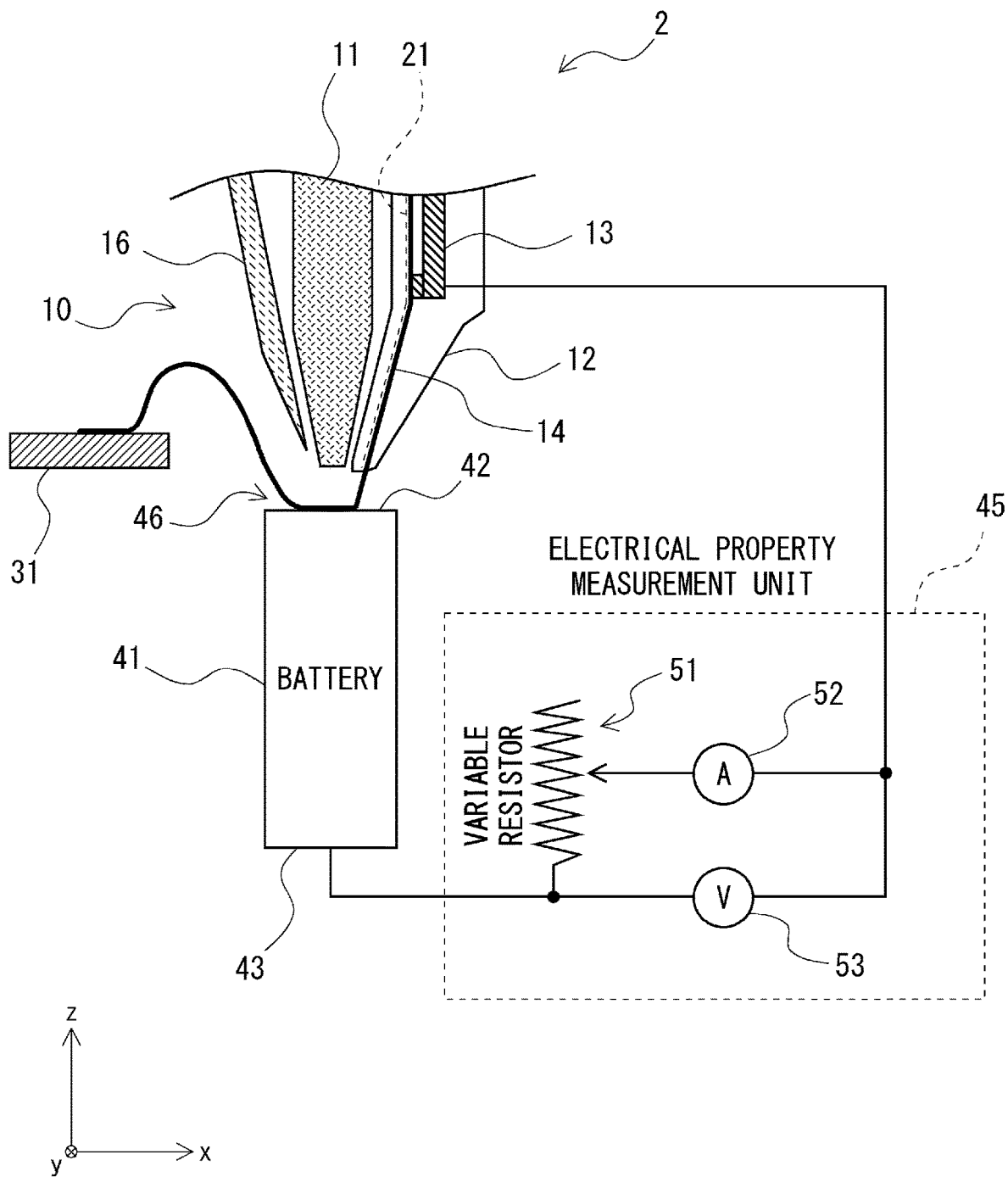
FIG. 5 is a view for describing a bonding apparatus according to a second embodiment.

Next, a second embodiment of the present disclosure will be described. FIG. 5 is a view for describing a bonding apparatus according to the second embodiment. In this embodiment, a terminal 31 and an electrode 42 of a battery 41 are connected to each other by a wire 14 using a bonding apparatus 2. The bonding apparatus 2 is the same as the bonding apparatus 1 described in the first embodiment except for this configuration. Thus, the same components are denoted by the same reference numerals, and repeated descriptions are omitted.

Also in this embodiment, the wire 14 is bonded to the terminal 31 through the processes of FIGS. 3A to 3C described in the first embodiment. After the wire 14 is bonded to the terminal 31, the head part 10 is moved above one electrode 42 of the battery 41 (corresponding to the process of FIG. 3D). After that, the head part 10 is moved to the negative side (the lower side) in the z-axis direction. Next, the leading end part of the bonding tool 11 is ultrasonically vibrated while the wire 14 is pressed against the electrode 42 using the bonding tool 11. Then, the wire 14 is bonded to the electrode 42 (corresponding to the process of FIG. 3E). Note that the electrode 42 may be a positive electrode or a negative electrode of the battery 41.

After that, as shown in FIG. 5, the wire 14 is fixed using the clamp 13, and a tensile test for pulling the wire 14 bonded to the electrode 42 with a predetermined load is carried out. Also in this embodiment, an electrical property test is carried out using the electrical property measurement unit 45. However, in this embodiment, an electrical resistance of the junction 46 between the wire 14 and the electrode 42 and an internal resistance of the battery 41 are measured using the electrical property measurement unit 45. Further, in this embodiment, an electromotive force of the battery 41 may be measured. Hereinafter, the electrical property test according to this embodiment will be described in detail.

As shown in FIG. 5, the electrical property measurement unit 45 included in the bonding apparatus 2 according to this embodiment includes a variable resistor 51, an ammeter 52, and a voltmeter 53. The variable resistor 51 is electrically connected between the clamp 13 and the other electrode 43 of the battery 41. The ammeter 52 is connected between the variable resistor 51 and the clamp 13, and measures a current flowing through the variable resistor 51. The voltmeter 53 is connected across the variable resistor 51, and measures a voltage across the variable resistor 51.

The following relationship holds, where the electromotive force of the battery 41 is E, a summed value of the electrical resistance of the junction 46 between the wire 14 and the electrode 42 and the internal resistance of the battery 41 is r, the current flowing through the variable resistor 51 is I, and the voltage across the variable resistor 51 is V.

$$V = E - rI \quad \text{Equation 1}$$

That is, as for the electromotive force E of the battery 41, the voltage V across the variable resistor 51 becomes equal to "E−rI", because the voltage drops due to the internal resistance of the battery 41 and the electrical resistance of the junction 46.

Further, the following relationships hold, where the current value measured by the ammeter 52 (i.e., the current flowing through the variable resistor 51) is $I_1$, the voltage value measured by the voltmeter 53 (i.e., the variable resistor 51) is $V_1$, which are measured when the resistance value of the variable resistor 51 is $R_1$, and the current value measured by the ammeter 52 (i.e., the current flowing through the variable resistor 51) is $I_2$, and the voltage value measured by the voltmeter 53 (i.e., the voltage of both ends of the variable resistor 51) is $V_2$, which are measured when the resistance value of the variable resistor 51 is $R_2$.

$$V_1 = E - rI_1 \quad \text{Equation 2}$$

$$V_2 = E - rI_2 \quad \text{Equation 3}$$

When simultaneous equations of Equations 2 and 3 are solved, the summed value r of the electrical resistance of the junction 46 and the internal resistance of the battery 41 can be expressed as follows.

$$r = (V_1 - V_2)/(I_2 - I_1) \quad \text{Equation 4}$$

Further, the electromotive force E of the battery 41 can be expressed as follows by substituting Equation 4 into Equation 2.

$$E = V_1 + I_1 \times (V_1 - V_2)/(I_2 - I_1) \quad \text{Equation 5}$$

That is, in this embodiment, the summed value r of the electrical resistance of the junction 46 and the internal resistance of the battery 41 and the electromotive force E can be calculated using the current value $I_1$ of the ammeter 52 and the voltage value $V_1$ of the voltmeter 53, which are measured when the variable resistor 51 is set to the resistance value $R_1$, and the current value $I_2$ of the ammeter 52 and the voltage value $V_2$ of the voltmeter 53, which are measured when the variable resistor 51 is set to the resistance value $R_2$.

The above-described embodiment can also simplify the electrical property test. Furthermore, in this embodiment, it is possible to detect a defect of the battery at an early stage, because the electromotive force of the battery can be measured at the same time when the electrical property test is carried out.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A bonding apparatus for bonding a wire to a terminal comprising:
    a bonding tool configured to bond the wire supplied to a leading end part of the bonding tool to the terminal;
    a guide member configured to guide the wire supplied to the leading end part of the bonding tool;
    a clamp made of a conductive material and configured to be able to fix the wire; and
    an electrical property measurement unit electrically connected to the clamp, wherein
    the clamp is configured to be electrically connected to the wire when it fixes the wire, and
    after the wire is bonded to the terminal using the bonding tool, the bonding apparatus carries out a tensile test of the wire bonded to the terminal using the clamp and pulling the wire bonded to the terminal with a predetermined load and an electrical property test for measuring an electrical resistance of a junction between the wire and the terminal using the electrical property measurement unit.

2. The bonding apparatus according to claim 1, wherein the guide member is made of an insulating material, and when the clamp fixes the wire, the wire is clamped by the guide member and the clamp.

3. The bonding apparatus according to claim 2, wherein the guide member includes a shape including a U-shaped cross section,
    the wire is disposed in such a way that it passes through inside of the U-shaped cross section of the guide member, and
    when the clamp fixes the wire, the wire is clamped by the guide member and the clamp inside the U-shaped cross section of the guide member.

4. The bonding apparatus according to claim 1, wherein the terminal is one electrode of a battery, and
    after the wire is bonded to the one electrode of the battery using the bonding tool, the bonding apparatus carries out a tensile test for fixing the wire using the clamp and pulling the wire bonded to the one electrode of the battery with a predetermined load and an electrical property test for measuring a summed value of an electrical resistance of a junction between the wire and the terminal and an internal resistance of the battery using the electrical property measurement unit.

5. The bonding apparatus according to claim 4, wherein the electrical property measurement unit further measures an electromotive force of the battery.

6. The bonding apparatus according to claim 5, wherein the electrical property measurement unit comprises:
    a variable resistor electrically connected between the clamp and another electrode of the battery;
    an ammeter configured to measure a current flowing through the variable resistor; and
    a voltmeter configured to measure a voltage across the variable resistor, and
    the electrical property measurement unit calculates the summed value of the electrical resistance in the junction and the internal resistance of the battery and the electromotive force using a first current value of the ammeter and a first voltage value of the voltmeter measured when the variable resistor is set to a first resistance value and a second current value of the ammeter and a second voltage value of the voltmeter measured when the variable resistor is set to a second resistance value.

7. A bonding method using a bonding apparatus for bonding a wire to a terminal comprising:
    a bonding tool configured to bond the wire supplied to a leading end part of the bonding tool to the terminal;
    a guide member configured to guide the wire supplied to the leading end part of the bonding tool;
    a clamp made of a conductive material and configured to be able to fix the wire and to be electrically connected to the wire when it fixes the wire; and
    an electrical property measurement unit electrically connected to the clamp, the bonding method comprising:
    a first process of bonding the wire to the terminal using the bonding tool; and
    after the first process, a second process of carrying out a tensile test of the wire bonded to the terminal using the clamp and pulling the wire bonded to the terminal with a predetermined load and an electrical property test for measuring an electrical resistance of a junction between the wire and the terminal using the electrical property measurement unit.

* * * * *